(12) United States Patent
Micheloni et al.

(10) Patent No.: US 10,152,273 B2
(45) Date of Patent: *Dec. 11, 2018

(54) NONVOLATILE MEMORY CONTROLLER AND METHOD FOR ERASE SUSPEND MANAGEMENT THAT INCREMENTS THE NUMBER OF PROGRAM AND ERASE CYCLES AFTER ERASE SUSPEND

(71) Applicant: IP GEM GROUP, LLC, Irvine, CA (US)

(72) Inventors: Rino Micheloni, Turate (IT); Antonio Aldarese, Vimercate (IT); Salvatrice Scommegna, Cornate d'Adda (IT)

(73) Assignee: IP GEM GROUP, LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/827,189

(22) Filed: Nov. 30, 2017

(65) Prior Publication Data

US 2018/0081589 A1    Mar. 22, 2018

Related U.S. Application Data

(63) Continuation of application No. 15/370,391, filed on Dec. 6, 2016, now Pat. No. 9,886,214.

(Continued)

(51) Int. Cl.
*G11C 11/34*     (2006.01)
*G06F 3/06*      (2006.01)
(Continued)

(52) U.S. Cl.
CPC .......... *G06F 3/0652* (2013.01); *G06F 3/0604* (2013.01); *G06F 3/0688* (2013.01);
(Continued)

(58) Field of Classification Search
USPC ...................................... 365/185.29
See application file for complete search history.

(56) References Cited

U.S. PATENT DOCUMENTS

| 815,137 A | 3/1906 | Beecher |
| 5,615,235 A | 3/1997 | Kakuishi et al. |

(Continued)

OTHER PUBLICATIONS

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

(Continued)

*Primary Examiner* — Son Dinh
(74) *Attorney, Agent, or Firm* — Glass & Associates; Kenneth Glass

(57) ABSTRACT

A nonvolatile memory controller and a method for erase suspend management are disclosed. The nonvolatile memory controller includes an erase suspend circuit configured for determining a pre-suspend time each time that an erase operation of the nonvolatile memory device is suspended and for determining whether an erase-suspend limit has been reached using the determined pre-suspend time. The erase suspend circuit is further configured for incrementing the number of program and erase cycles when the erase-suspend limit has been reached.

20 Claims, 11 Drawing Sheets

Related U.S. Application Data

(60) Provisional application No. 62/266,261, filed on Dec. 11, 2015.

(51) Int. Cl.

| | | |
|---|---|---|
| *G06F 12/00* | (2006.01) | |
| *G11C 16/16* | (2006.01) | |
| *G11C 16/32* | (2006.01) | |
| *G11C 16/04* | (2006.01) | |
| *G11C 16/34* | (2006.01) | |

(52) U.S. Cl.
CPC .............. *G06F 12/00* (2013.01); *G11C 16/16* (2013.01); *G11C 16/32* (2013.01); *G11C 16/0483* (2013.01); *G11C 16/349* (2013.01); *G11C 2216/20* (2013.01)

(56) References Cited

U.S. PATENT DOCUMENTS

| | | | |
|---|---|---|---|
| 5,732,092 | A | 3/1998 | Shinohara |
| 5,822,244 | A | 10/1998 | Hansen et al. |
| 5,875,343 | A | 2/1999 | Binford et al. |
| 6,115,788 | A | 9/2000 | Thowe |
| 6,412,041 | B1 | 6/2002 | Lee et al. |
| 6,539,515 | B1 | 3/2003 | Gong |
| 6,567,313 | B2 | 5/2003 | Tanaka et al. |
| 6,633,856 | B2 | 10/2003 | Richardson et al. |
| 6,725,409 | B1 | 4/2004 | Wolf |
| 6,789,227 | B2 | 9/2004 | De Souza et al. |
| 6,871,168 | B1 | 3/2005 | Tanaka et al. |
| 6,895,547 | B2 | 5/2005 | Eleftheriou et al. |
| 6,934,804 | B2 | 8/2005 | Hashemi |
| 6,963,507 | B2 | 11/2005 | Tanaka et al. |
| 6,976,194 | B2 | 12/2005 | Cypher |
| 6,976,197 | B2 | 12/2005 | Faust et al. |
| 7,050,334 | B2 | 5/2006 | Kim et al. |
| 7,116,732 | B2 | 10/2006 | Worm et al. |
| 7,206,992 | B2 | 4/2007 | Xin et al. |
| 7,209,527 | B2 | 4/2007 | Smith et al. |
| 7,237,183 | B2 | 6/2007 | Xin |
| 7,324,559 | B2 | 1/2008 | McGibney |
| 7,376,015 | B2 | 5/2008 | Tanaka et al. |
| 7,450,668 | B2 | 11/2008 | Ghosh et al. |
| 7,457,906 | B2 | 11/2008 | Pettey et al. |
| 7,472,331 | B2 | 12/2008 | Kim et al. |
| 7,484,158 | B2 | 1/2009 | Sharon et al. |
| 7,529,215 | B2 | 5/2009 | Osterling |
| 7,567,472 | B2 | 7/2009 | Gatzemeier et al. |
| 7,620,784 | B2 | 11/2009 | Panabaker et al. |
| 7,650,480 | B2 | 1/2010 | Jiang et al. |
| 7,694,047 | B1 | 4/2010 | Alston |
| 7,708,195 | B2 | 5/2010 | Yoshida et al. |
| 7,739,472 | B2 | 6/2010 | Guterman et al. |
| 7,752,346 | B2 | 7/2010 | Talayco et al. |
| 7,801,233 | B1 | 9/2010 | Chow et al. |
| 7,860,930 | B2 | 12/2010 | Freimuth et al. |
| 7,904,793 | B2 | 3/2011 | Mokhlesi et al. |
| 7,930,623 | B2 | 4/2011 | Pisek et al. |
| 7,937,641 | B2 | 5/2011 | Amidi |
| 7,945,721 | B1 | 5/2011 | Johnsen et al. |
| 7,958,430 | B1 | 6/2011 | Kolokowsky et al. |
| 7,975,193 | B2 | 7/2011 | Johnson |
| 8,094,508 | B2 | 1/2012 | Gatzemeier et al. |
| 8,140,930 | B1 | 3/2012 | Maru |
| 8,176,367 | B2 | 5/2012 | Dreifus et al. |
| 8,219,894 | B2 | 7/2012 | Au et al. |
| 8,223,745 | B2 | 7/2012 | Johnsen et al. |
| 8,228,728 | B1 | 7/2012 | Yang et al. |
| 8,244,946 | B2 | 8/2012 | Gupta et al. |
| 8,245,112 | B2 | 8/2012 | Hicken et al. |
| 8,245,117 | B1 | 8/2012 | Wu |
| 8,250,286 | B2 | 8/2012 | Yeh et al. |
| 8,254,112 | B2 | 8/2012 | Yang et al. |
| 8,255,770 | B2 | 8/2012 | Park et al. |
| 8,259,498 | B2 | 9/2012 | Yogev et al. |
| 8,259,506 | B1 | 9/2012 | Sommer et al. |
| 8,261,136 | B2 | 9/2012 | D'Abreu et al. |
| 8,281,217 | B2 | 10/2012 | Kim et al. |
| 8,281,227 | B2 | 10/2012 | Inskeep et al. |
| 8,286,004 | B2 | 10/2012 | Williams |
| 8,307,258 | B2 | 11/2012 | Flynn et al. |
| 8,327,220 | B2 | 12/2012 | Borchers et al. |
| 8,335,977 | B2 | 12/2012 | Weingarten et al. |
| 8,341,502 | B2 | 12/2012 | Steiner et al. |
| 8,351,258 | B1 | 1/2013 | Yang et al. |
| 8,359,522 | B2 | 1/2013 | Gunnam et al. |
| 8,392,789 | B2 | 3/2013 | Biscondi et al. |
| 8,402,201 | B2 | 3/2013 | Strasser et al. |
| 8,418,023 | B2 | 4/2013 | Gunnam et al. |
| 8,429,325 | B1 | 4/2013 | Onufryk et al. |
| 8,429,497 | B2 | 4/2013 | Tu et al. |
| 8,473,812 | B2 | 6/2013 | Ramamoorthy et al. |
| 8,493,791 | B2 | 7/2013 | Karakulak et al. |
| 8,504,885 | B2 | 8/2013 | Haratsch et al. |
| 8,504,887 | B1 | 8/2013 | Varnica et al. |
| 8,555,140 | B2 | 10/2013 | Gunnam et al. |
| 8,621,318 | B1 | 12/2013 | Micheloni et al. |
| 8,638,602 | B1 | 1/2014 | Horn et al. |
| 8,640,005 | B2 | 1/2014 | Wilkerson et al. |
| 8,645,613 | B2 | 2/2014 | Tan et al. |
| 8,656,257 | B1 | 2/2014 | Micheloni et al. |
| 8,665,648 | B2 | 3/2014 | Mun et al. |
| 8,694,849 | B1 | 4/2014 | Micheloni et al. |
| 8,694,855 | B1 | 4/2014 | Micheloni et al. |
| 8,706,956 | B2 | 4/2014 | Cagno et al. |
| 8,707,122 | B1 | 4/2014 | Micheloni et al. |
| 8,737,141 | B2 | 5/2014 | Melik-Martirosian |
| 8,739,008 | B2 | 5/2014 | Liu et al. |
| 8,755,229 | B1 | 6/2014 | Visconti et al. |
| 8,762,620 | B2 | 6/2014 | Prins et al. |
| 8,769,374 | B2 | 7/2014 | Franceschini et al. |
| 8,775,913 | B2 | 7/2014 | Haratsch et al. |
| 8,787,428 | B2 | 7/2014 | Dai et al. |
| 8,856,622 | B2 | 10/2014 | Ramamoorthy et al. |
| 8,898,372 | B2 | 11/2014 | Yeh |
| 8,917,734 | B1 | 12/2014 | Brown |
| 8,924,824 | B1 | 12/2014 | Lu |
| 8,953,373 | B1 | 2/2015 | Haratsch et al. |
| 8,958,247 | B2 | 2/2015 | Asaoka et al. |
| 8,959,280 | B2 | 2/2015 | Ma et al. |
| 8,984,216 | B2 | 3/2015 | Fillingim |
| 8,995,197 | B1 | 3/2015 | Steiner et al. |
| 8,995,302 | B1 | 3/2015 | Brown et al. |
| 9,025,495 | B1 | 5/2015 | Onufryk et al. |
| 9,058,289 | B2 | 6/2015 | Tai et al. |
| 9,142,314 | B2 | 9/2015 | Beltrami et al. |
| 9,164,891 | B2 | 10/2015 | Karamcheti et al. |
| 9,244,763 | B1 | 1/2016 | Kankani et al. |
| 9,251,909 | B1 | 2/2016 | Camp et al. |
| 9,257,182 | B2 | 2/2016 | Grunzke |
| 9,268,531 | B1 | 2/2016 | Son et al. |
| 9,292,428 | B2 | 3/2016 | Kanamori et al. |
| 9,294,132 | B1 | 3/2016 | Peleato-Inarrea et al. |
| 9,444,655 | B2 | 9/2016 | Sverdlov et al. |
| 9,886,214 | B2 * | 2/2018 | Micheloni ............. G06F 3/0652 |
| 9,916,906 | B2 | 3/2018 | Wu et al. |
| 2002/0051501 | A1 | 5/2002 | Demjanenko et al. |
| 2002/0129308 | A1 | 9/2002 | Kinoshita et al. |
| 2002/0181438 | A1 | 12/2002 | McGibney |
| 2003/0033567 | A1 | 2/2003 | Tamura et al. |
| 2003/0104788 | A1 | 6/2003 | Kim |
| 2003/0225970 | A1 | 12/2003 | Hashemi |
| 2004/0088636 | A1 | 5/2004 | Cypher |
| 2004/0123230 | A1 | 6/2004 | Lee et al. |
| 2004/0136236 | A1 | 7/2004 | Cohen et al. |
| 2004/0181735 | A1 | 9/2004 | Xin |
| 2004/0234150 | A1 | 11/2004 | Chang |
| 2004/0252791 | A1 | 12/2004 | Shen et al. |
| 2004/0268015 | A1 | 12/2004 | Pettey et al. |
| 2005/0010846 | A1 | 1/2005 | Kikuchi et al. |
| 2005/0226355 | A1 | 10/2005 | Kibune et al. |
| 2005/0248999 | A1 | 11/2005 | Tamura et al. |
| 2005/0252791 | A1 | 11/2005 | Pechtold et al. |

(56) References Cited

U.S. PATENT DOCUMENTS

| | | |
|---|---|---|
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0101225 A1 | 5/2007 | Moon et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1 | 9/2012 | Melik-Martirosian et al. |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1 | 1/2013 | Livshitz et al. |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0029336 A1 | 1/2014 | Venkitachalam et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0164881 A1 | 6/2014 | Chen et al. |
| 2014/0181426 A1 | 6/2014 | Grunzke et al. |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0281767 A1 | 9/2014 | Alhussien et al. |
| 2014/0281771 A1 | 9/2014 | Yoon et al. |
| 2014/0281808 A1 | 9/2014 | Lam et al. |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1 | 5/2015 | Chen et al. |
| 2015/0131373 A1 | 5/2015 | Alhussien et al. |
| 2015/0149871 A1 | 5/2015 | Chen et al. |
| 2015/0169468 A1 | 6/2015 | Camp et al. |
| 2015/0186055 A1 | 7/2015 | Darragh |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1 | 2/2016 | Alrod et al. |
| 2016/0071601 A1 | 3/2016 | Shirakawa et al. |
| 2016/0072527 A1 | 3/2016 | Tadokoro et al. |
| 2016/0155507 A1 | 6/2016 | Grunzke |
| 2016/0179406 A1 | 6/2016 | Gorobets et al. |
| 2016/0247581 A1 | 8/2016 | Yoshida et al. |
| 2016/0293259 A1 | 10/2016 | Kim et al. |
| 2017/0147135 A1* | 5/2017 | Higashibeppu ....... G06F 3/0416 |
| 2017/0213597 A1 | 7/2017 | Micheloni et al. |
| 2018/0033490 A1 | 2/2018 | Marelli et al. |

OTHER PUBLICATIONS

Chen, et al., "Increasing flash memory lifetime by dynamic voltage allocation for constant mutual information", 2014 Information Theory and Applications Workshop (ITA), 2014, pp. 1-5.

Peleato, et al., "Probabilistic graphical model for flash memory programming", Statistical Signal Processing Workshop (SSP), 2012 IEEE, 2012, pp. 1-4.

Wu, et al., "Reducing SSD Read Latency via NAND Flash Program and Erase Suspension", Proceedings of FAST'2012; Department of

(56) References Cited

OTHER PUBLICATIONS

Electrical and Computer Engineering Virginia Commonwealth University, Richmond, VA 23284, 2012, pp. 117-123.

* cited by examiner

NONVOLATILE MEMORY CONTROLLER AND METHOD FOR ERASE SUSPEND MANAGEMENT THAT INCREMENTS THE NUMBER OF PROGRAM AND ERASE CYCLES AFTER ERASE SUSPEND

BACKGROUND

Nonvolatile memory manufacturers such as manufacturers of NAND flash memory devices typically specify a maximum number of erase suspend operations for devices that allow for erase suspend operations. Exceeding the number of erase suspend operations specified in the operating specification can lead to either a higher raw Bit Error Rate (BER) or a bad block condition. Erase suspend means suspension of an erase command prior to completion of the erasure.

For some 1× nanometer TLC NAND devices the maximum number of erase suspends is only 10, or in some cases may be less than 10. This low number of allowed erase suspends is not sufficient to obtain desired quality of service levels.

Accordingly, there is a need for a method and apparatus that allows for increasing the number of erase suspend operations and that does not increase the BER or cause a bad block condition as a result of erase suspend operations.

SUMMARY

A method is disclosed that includes identifying an erase-suspend limit and determining a pre-suspend time each time that an erase operation is suspended. The method includes determining whether the erase-suspend limit has been reached using the determined pre-suspend time and preventing subsequent suspends of the erase operation when the erase-suspend limit has been reached.

A nonvolatile memory controller is disclosed that is configured to perform erase operations on memory cells of nonvolatile memory devices and that includes an erase suspend circuit. The erase suspend circuit is configured for determining a pre-suspend time each time that an erase operation of the nonvolatile memory device is suspended. The determined pre-suspend time for a first suspend of the erase operation is the time between a start of the erase operation and the first suspend of the erase operation, and the determined pre-suspend time for each additional suspend of the erase operation is the time between a resumption of the erase operation and the following suspend of the erase operation. The erase suspend circuit is configured for determining whether an erase-suspend limit has been reached using the determined pre-suspend time and is configured for preventing subsequent suspends of the erase operation when the erase-suspend limit has been reached.

A nonvolatile memory system is disclosed that includes a plurality of nonvolatile memory devices and a memory controller coupled to each of the nonvolatile memory devices. The nonvolatile memory controller includes an erase suspend circuit configured for determining a pre-suspend time each time that an erase operation of the nonvolatile memory device is suspended, for determining whether an erase-suspend limit has been reached using the determined pre-suspend time and for preventing subsequent suspends of the erase operation when the erase-suspend limit has been reached.

By preventing subsequent suspends of the erase operation when the erase-suspend limit has been reached, and identification of one or more erase-suspend limit that corresponds to the characteristics of the nonvolatile memory devices, the methods and apparatus of the present invention maintain BER of the nonvolatile memory devices within the range required to maintain manufacturer-specified endurance and retention specifications while allowing for more erase suspends than the number specified by the manufacturer of the nonvolatile memory devices.

BRIEF DESCRIPTION OF THE DRAWINGS

The accompanying drawings, which are incorporated in and form a part of this specification, illustrate various embodiments and, together with the Description of Embodiments, serve to explain principles discussed below. The drawings referred to in this brief description should not be understood as being drawn to scale unless specifically noted.

DETAILED DESCRIPTION

Reference will now be made in detail to various embodiments, examples of which are illustrated in the accompanying drawings. While various embodiments are discussed herein, it will be understood that they are not intended to be limiting. On the contrary, the presented embodiments are intended to cover alternatives, modifications and equivalents, which may be included within the spirit and scope the various embodiments as defined by the appended claims. Furthermore, in this Detailed Description of the Invention, numerous specific details are set forth in order to provide a thorough understanding. However, embodiments may be practiced without one or more of these specific details. In other instances, well known methods, procedures, components, and circuits have not been described in detail as not to unnecessarily obscure aspects of the described embodiments.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, regions, layer or section discussed below could be termed a second element, component, region, layer or section without departing from the teachings of the present invention.

Figure 1:
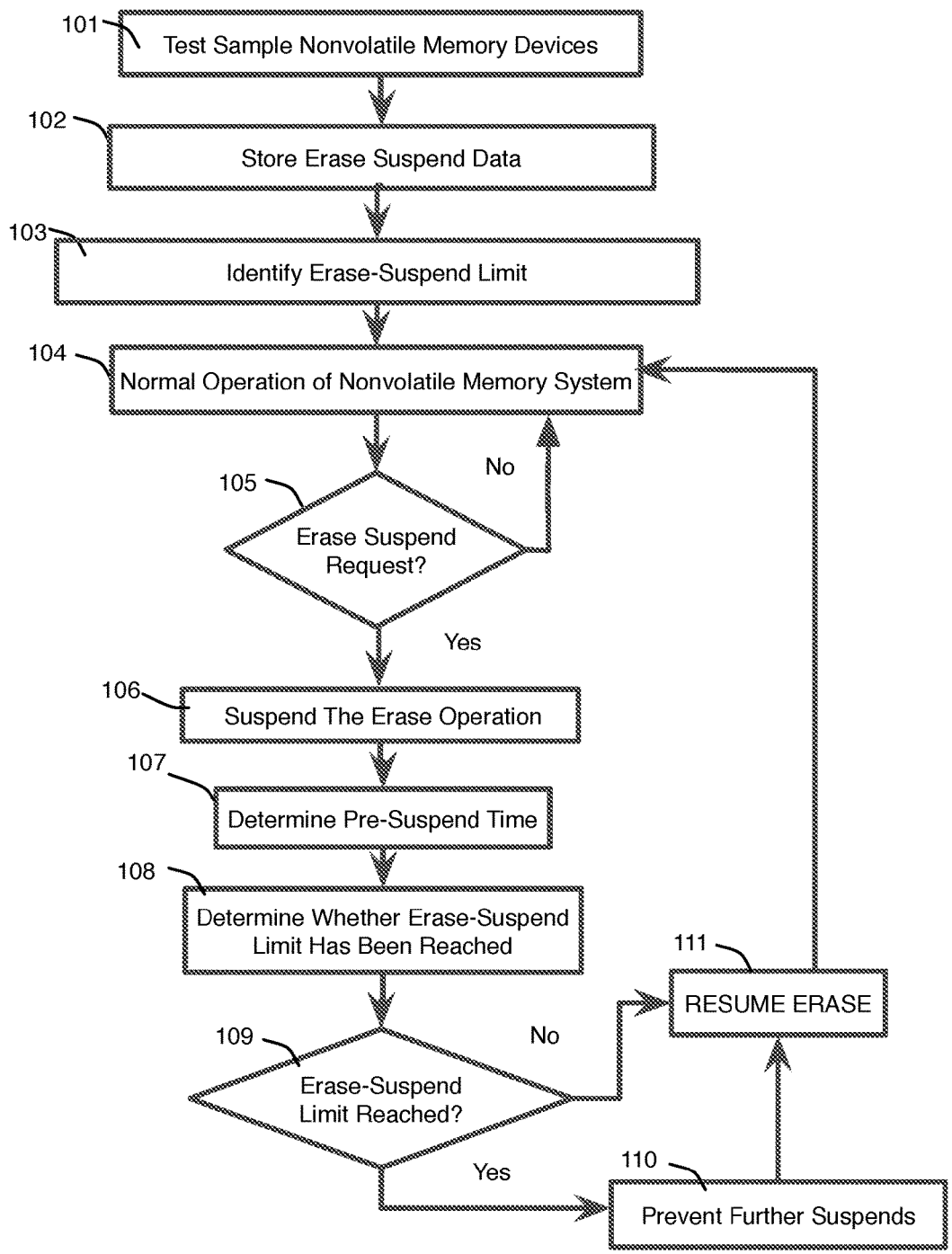
FIG. 1 is a flow diagram illustrating a method for erase suspend management in accordance with an embodiment of the present invention.

Referring now to FIG. 1 a method for erase suspend management 100 is shown that includes testing 101 sample nonvolatile memory devices in a test lab. The sample nonvolatile memory devices are similar to nonvolatile memory devices 20 shown in FIG. 2, and may be the same manufacturer, the same model, type and manufacturing batch as nonvolatile memory devices 20. The testing may determine one or more erase-suspend limit and one or more pre-suspend time threshold that will maintain the operation of the sample nonvolatile memory devices within required bit error rates established for the sample nonvolatile memory devices. In one embodiment, the erase-suspend limit(s) is chosen to obtain the highest possible number of erase suspends while maintaining the operation of the sample nonvolatile memory devices within required bit error rates established for the sample nonvolatile memory devices.

Nonvolatile memory system 10 includes a nonvolatile memory controller 11 in communication with a host computer 1, a nonvolatile storage module 18 and external memory 17 which may be, for example one or more DRAM. Nonvolatile memory controller 11 includes memory storage 12 that may include one or more volatile or nonvolatile memory location for storing data. Nonvolatile memory storage module 18 includes a plurality of nonvolatile memory devices 20 for storing data. Nonvolatile memory devices 20 may be NAND devices, with each NAND device 20 including one or more packaged semiconductor die that is coupled to nonvolatile memory controller 11. In one exemplary embodiment, each NAND device 20 is coupled to nonvolatile memory controller 11 by chip enable line (CE#), a command latch enable (CLE) line, a read enable signal line (RE#), an address latch enable (ALE) signal line, a write enable single line (WE#), a read/busy (RB) signal line and input and output (I/O) signal lines.

Figure 3:
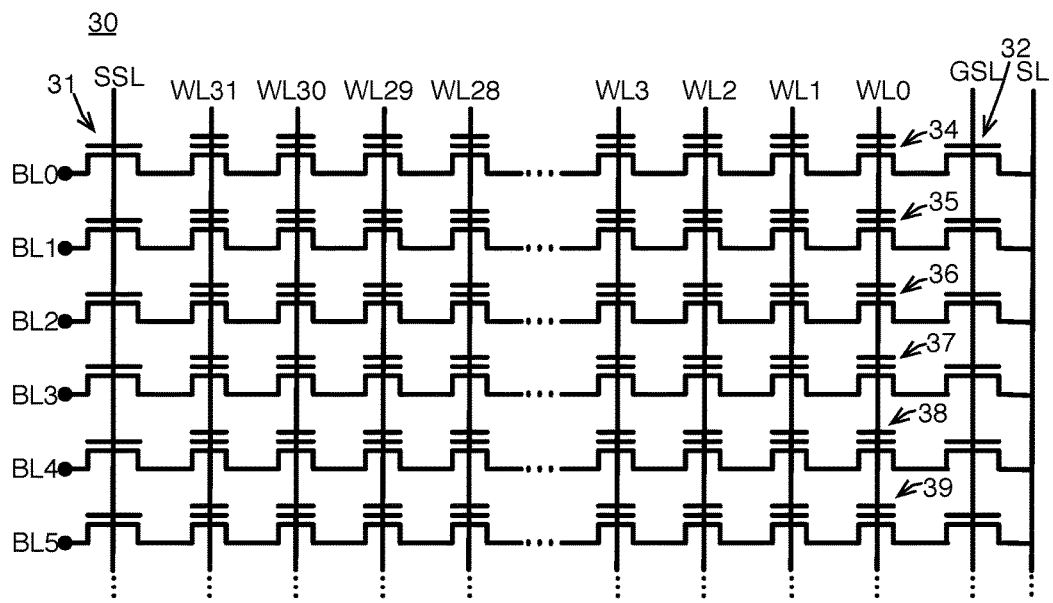
FIG. 3 is a diagram illustrating a NAND array in accordance with an embodiment of the present invention.

Each NAND device 20 includes memory cells that are organized into blocks and pages, with each block composed of NAND strings that share the same group of word lines. A logical page is composed of cells belonging to the same word line. The number of logical pages within logical block is typically a multiple of 16 (e.g. 64, 128). In the present embodiment, a logical page is the smallest addressable unit for reading from and writing to the NAND memory and a logical block is the smallest erasable unit. However, it is appreciated that in embodiments of the present invention programming to less than an entire page may be possible, depending on the structure of the NAND array. An exemplary NAND array 30 is shown in FIG. 3 that is made of memory cells connected in series to form NAND strings. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0). Though FIG. 3 illustrates an embodiment in which memory cells are single level cells, it is appreciated that NAND devices 20 can also be multi-level cell NAND devices and can store, for example, 2 bits per cell, 3 bits per cell or 4 bits per cell.

Each logical page is composed of a main data area and a spare area. The main data area may have the size of 4 kB, 8 kB, 16 kB or larger. The spare area is made up of hundreds of bytes for every 4 kB of main data storage area.

Erase suspend data is stored as shown by step 102 of FIG. 1. The erase suspend data includes the erase-suspend limit(s) and pre-suspend time threshold(s) determined in step 101. In the embodiment shown in FIG. 2 erase-suspend limit(s) and corresponding pre-suspend time threshold(s) are stored in nonvolatile memory system 10 (e.g., in memory storage 12, the spare area of one or more pages of each NAND device 20 or on external memory device 17).

In the present embodiment testing of sample nonvolatile memory devices is performed and the resulting erase suspend data is stored on memory storage 12 prior to shipping nonvolatile memory system 10 or nonvolatile memory controller 11 to a customer. In one specific embodiment erase suspend data is stored in memory storage 12 of nonvolatile memory controller 11 prior to shipping nonvolatile memory controller 11 to a customer. Alternatively, the erase suspend data may be included in the configuration data for nonvolatile memory controller 11 and may be stored externally to nonvolatile memory controller 11 and may be loaded into memory storage 12 or external memory 17 upon configuration of nonvolatile memory controller 11.

Method 100 further includes identifying an erase-suspend limit 103. The erase-suspend limit may be identified by reading the location in memory in which the erase-suspend limit was stored in step 102. Nonvolatile memory controller 11 may include a status circuit 13 configured to determine usage characteristics of NAND devices 20 such as, for example, the number or program and erase cycles of each block of each NAND device 20. In one embodiment the erase-suspend limit may be computed using the stored erase suspend data and the determined usage characteristics. In one specific embodiment the stored erase suspend data includes a table indicating program and erase cycles values and corresponding erase-suspend limit values and pre-suspend time threshold values, with the values to be used determined by indexing the table with the current number of program and erase cycles of the block of the NAND device 20 being erased. As the ease of erasing NAND devices 20 and BER varies as the number of program and erase cycles increases, this provides identification of an erase-suspend limit that is more accurate since it represents the current point of the lifetime of the NAND device being erased.

Normal operations of the nonvolatile memory system are performed 104, which may include reading, programming and erasing NAND devices 20 as well as housekeeping operations such as wear leveling and bad block management. In the embodiment shown in FIG. 2, nonvolatile memory controller 11 includes read circuit 14 that is operable to perform reads of NAND devices 20 and program and erase circuit 15 that is operable to perform program and erase operations on NAND devices 20.

Figure 4:
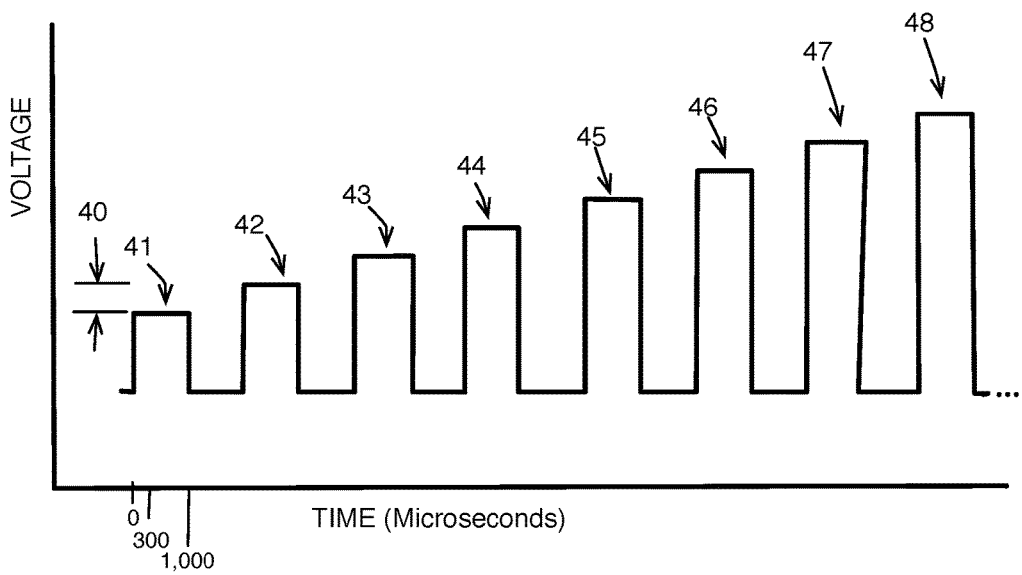
FIG. 4 is a diagram illustrating an erase operation in accordance with an embodiment of the present invention.

When an erase operation is being performed, nonvolatile memory controller 11 may receive an erase suspend request 105 from Host 1. If an erase suspend request is not received during an erase operation, normal operation is continued, allowing the erase operation to be performed without suspension. In a typical erase operation, as shown in FIG. 4, a number of pulses 41-48 are applied to the cells being erased, with the voltage of each successive pulse 41-48 increased by a voltage step 40. A verification process is performed after each erase pulse 41-48 to determine whether the erase operation was successful. The process of applying successively higher erase voltage pulses continues until the erase verify indicates that the cells have been successfully erased or until a maximum number of erase steps have been performed. The erase pulses shown in FIG. 4 are shown to have a duration of approximately 1,000 microseconds. However, alternatively, pulses 41-48 could have longer or shorter duration.

It has been found that the effectiveness of the erase is lower at the beginning of the pulse. As a result, successive applications of a short pulse will not have the same effect on the nonvolatile memory device as longer pulses or complete pulses. Accordingly, when an erase operation is suspended a number of times, the effects of the suspensions on the BER of the nonvolatile memory device will vary depending on the amount of time that the voltage was applied during the erase operation.

Figure 5A:
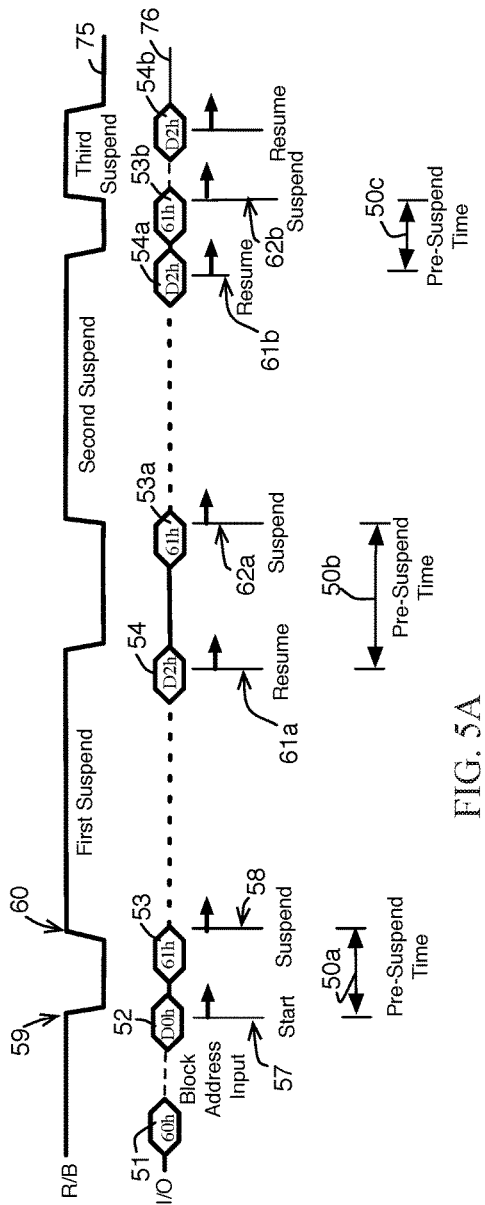
FIG. 5A is a diagram illustrating communications between a nonvolatile memory controller and a NAND device during an erase and an erase suspend of the NAND device in accordance with an embodiment of the present invention.

When a request for suspension of the erase operation is received 105 at nonvolatile memory controller 11, the erase operation of the nonvolatile memory device is suspended 106 unless the erase-suspend limit has been reached 109. In the embodiment shown in FIG. 5A the erase operation is initiated by sending an erase command (e.g., an erase block command) 51 followed by the block address of the block that is to be erased and an erase command 52 which may be, for example an erase block command transmitted over an input and output (I/O) signal line 76 from nonvolatile memory controller 11 to the NAND device 20 being erased. As the NAND device 20 performs the erase operation it may generate a logical low 59 of the read/busy signal line of the NAND device 20 being erased. Step 106 includes sending an erase suspend command 53 to the NAND device 20 that is being erased. When the NAND device 20 stops the erase operation and is ready for new instructions the value in one or more registers on the NAND device 20 are changed and the read/busy (RB) output 75 of the NAND device 20 is raised to a logical high 60 which appears on I/O signal line 76.

Pre-suspend time is determined 107 each time that the erase operation of the nonvolatile memory device is suspended 106. Pre-suspend time for a first suspend of the erase operation is the time between a start of the erase operation and the first suspend of the erase operation. In the embodiment shown in FIG. 5A the pre-suspend time 50*a* for the first suspend is determined to be the time between sending the erase command 52 to the NAND device 20 being erased, shown as erase start time 57 and the time at which the erase operation is suspended, shown as erase pre-suspend time 58.

Pre-suspend time for each additional suspend of the erase operation is the time between a resumption of the erase operation and the following suspend of the erase operation. In the embodiment shown in FIG. 5A the pre-suspend time 50*b* for a second suspend is determined to be the time between sending the resume command 54 to the NAND device 20 being erased, shown as resume erase 61*a* and the time at which the erase operation is suspended 62*a*. Similarly, the pre-suspend time 50*c* for a third suspend is determined to be the time between sending the resume command 54*a* to the NAND device 20 being erased, shown as resume erase time 61*b* and the time at which the erase operation is suspended 62*b*.

The time at which the erase operation is suspended can also be determined using the time at which the erase suspend command is sent from nonvolatile memory controller 11 to the NAND device 20 being erased. In this embodiment the pre-suspend time is determined to be the time between sending the erase function start command 52 (e.g., D0 h) and the suspend command 53 (e.g., 61 h) or the time between sending the resume command 54 (e.g., D2 h) and the suspend command 53*a* (e.g., 61 h).

Figure 5B:
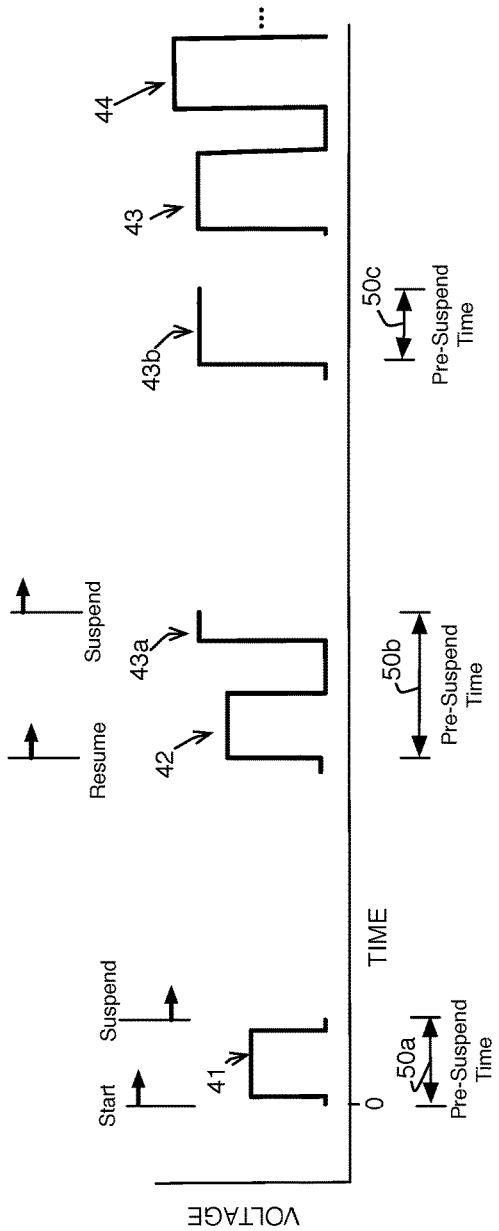
FIG. 5B is a diagram illustrating the voltage pulses applied to the NAND device during the erase and erase suspend operations of FIG. 5A in accordance with an embodiment of the present invention

With reference now to FIG. 5B it can be seen that during pre-suspend time 50*a* voltage pulse 41 is applied to the cell being erased. During erase pre-suspend time 50*b* the voltage of pulse 42 is applied to the cell being erased, and after the verification step, the voltage of pulse 43 is applied to the cell which is suspended prior to completion to yield incomplete voltage pulse 43*a*. During pre-suspend time 50*c*, the voltage of pulse 43 is again applied to the cell which is suspended prior to completion to yield incomplete voltage pulse 43*b*.

After each suspend of the erase operation a determination is made as to whether the erase suspend limit has been reached 108. When the erase-suspend limit has not been reached the erase is resumed 111 (e.g., by sending a resume command 54, 54*a,* 54*b* to the NAND device 20) and normal operations are continued 104. When the erase-suspend limit has been reached 109 subsequent suspends of the erase operation are prevented 110 and the present erase operation is resumed 111 and allowed to complete without further suspension. More particularly, the presently ongoing erase operation on the block is not allowed to be suspended further. Subsequent erase operations of this particular block are treated separately, with each subsequent erase operation requiring performance of steps 105-111 when an erase suspend request is received during the subsequent erase operation.

Figure 2:
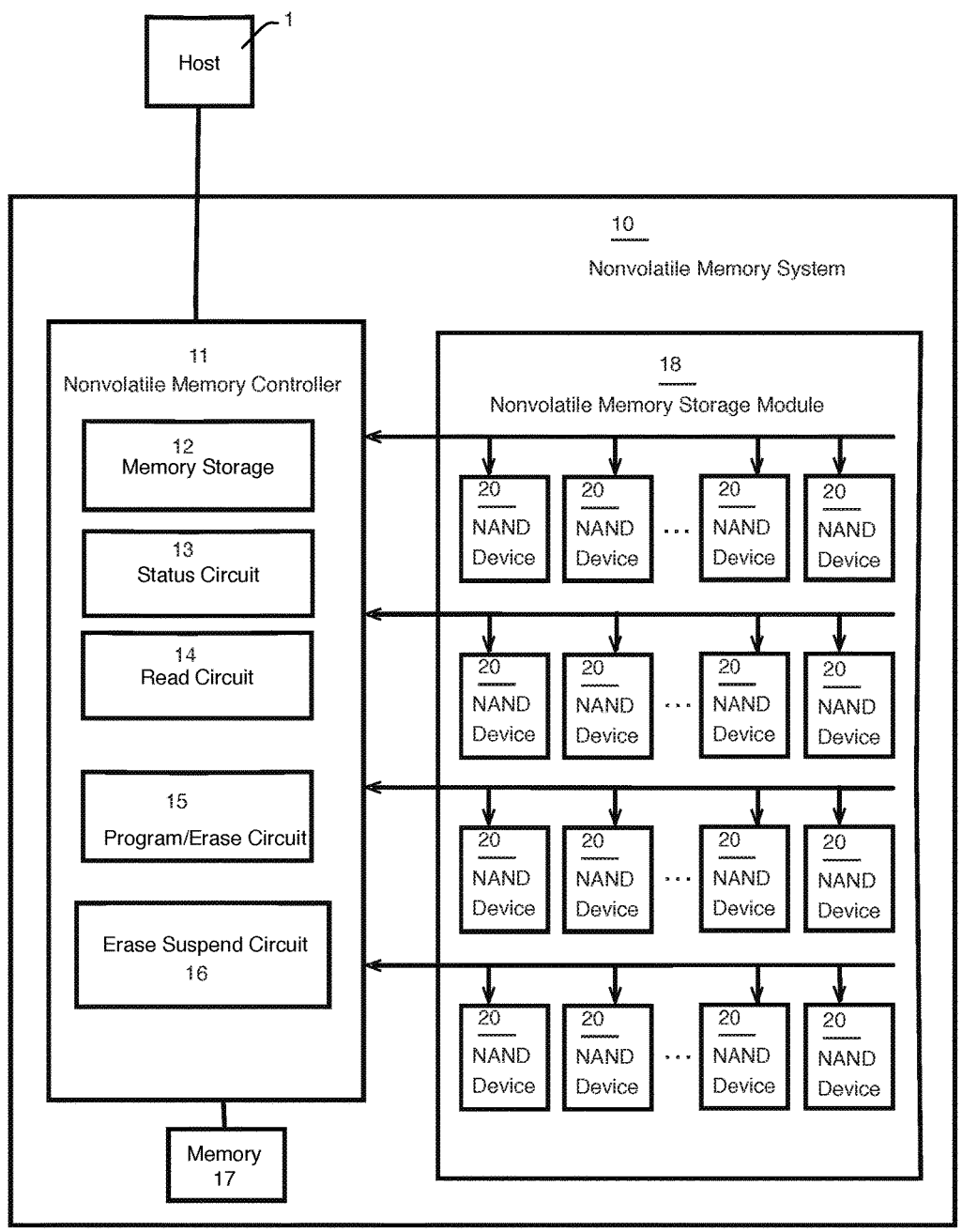
FIG. 2 is a block diagram illustrating a nonvolatile memory system in accordance with an embodiment of the present invention.

In the embodiment shown in FIG. 2 erase suspend circuit 16 is configured for determining a pre-suspend time for each occurrence where an erase operation of the nonvolatile memory device is suspended, for determining whether an erase-suspend limit has been reached using the determined pre-suspend time and for preventing subsequent suspends of the erase operation when the erase-suspend limit has been reached. In the present embodiment erase suspend circuit 16 is operable to monitor program and erase circuit 15 and start a timer when the erase command 52 is sent to the NAND device being erased. Erase suspend circuit 16 is operable for monitoring a register of the NAND device 20 being erased that indicates when the erase operation has been suspended, and stopping the timer when the value in the register changes to indicate suspension of the erase operation. Alternatively, the read/busy signal can be used as an indicator to determine when the erase operation has been suspended. In this embodiment the time at which the erase operation is suspended is the time at which the erase/busy output of the NAND device being erased transitions back to a logical high 60.

By preventing subsequent suspends of the erase operation when the erase-suspend limit has been reached, and identification of one or more erase-suspend limit that correspond to the characteristics of nonvolatile memory devices 20, the methods and apparatus of the present invention maintain BER of nonvolatile memory devices 20 within the range required to maintain manufacturer-specified endurance and retention specifications while allowing for more erase suspends than the number specified by the manufacturer of nonvolatile memory devices 20.

Figure 6:
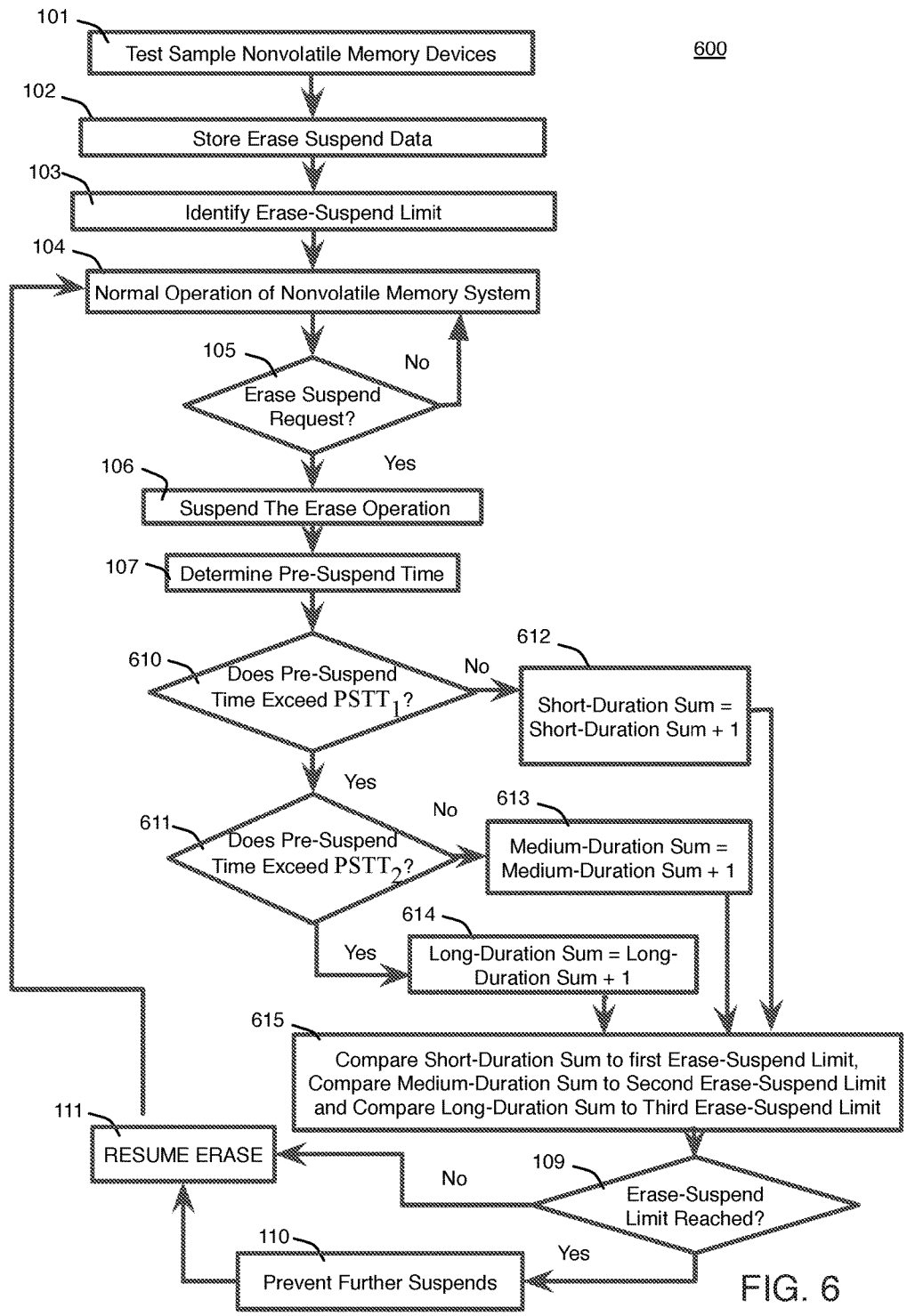
FIG. 6 is a flow diagram illustrating a method for erase suspend management in which two pre-suspend time thresholds are used in accordance with an embodiment of the present invention.

A method 600 is illustrated in FIG. 6 in which pre-suspend time is categorized into three groupings, one group that includes pre-suspend times having a short-duration, a second group that includes pre-suspend times having a medium-duration and a third group that includes pre-suspend times having longer-duration. In this embodiment the testing of step 101 determines an erase-suspend limit that includes a first erase-suspend limit, a second erase-suspend limit and a third erase-suspend limit. The testing also identifies a first pre-suspend time threshold and a second pre-suspend time threshold that define the three groupings of pre-suspend time, with the first pre-suspend time threshold having a value that is less than the second pre-suspend time threshold.

The number of suspends having a pre-suspend time that does not exceed 610 a first pre-suspend time threshold ($STT_1$) is summed 612 to obtain a first sum. This first sum indicates the number of erase suspends with pre-suspend time having a short duration and may be referred to hereinafter as the short-duration sum.

The number of suspends having a pre-suspend time that exceeds 610 the first pre-suspend time threshold and that does not exceed 611 the second pre-suspend time threshold ($STT_2$) is summed 613 to obtain a second sum. This second sum indicates the number of erase suspends with pre-suspend time having a medium duration and may be referred to hereinafter as the medium-duration sum.

The number of suspends having a pre-suspend time that exceeds 611 the second pre-suspend time threshold is summed 614 to obtain a third sum. This third sum indicates the number of erase suspends with pre-suspend time having a longer duration and may be referred to hereinafter as the long-duration sum.

The summing of steps 612-614 is done for each block being erased. For example, counters in erase suspend circuit 16 may be incremented upon each erase suspend operation and the results stored in memory storage 12.

The sums from steps 612, 613 and 614 are compared 615 to the corresponding erase suspend limits to determine when the erase-suspend limit has been reached. More particularly, the short duration sum is compared to the first erase-suspend limit, the medium duration sum is compared to the second erase-suspend limit and the long duration sum is compared to the third erase-suspend limit. The erase-suspend limit is reached when the short duration sum reaches the first erase-suspend limit or when the medium duration sum reaches the second erase-suspend limit or when the long duration sum reaches the third erase-suspend limit. In the present embodiment, the first erase-suspend limit is greater than the second erase-suspend limit and the second erase-suspend limit is greater than the third erase-suspend limit such that more short-duration-pre-suspend-time suspends are allowed than medium-duration-pre-suspend-time suspends, and more medium-duration-pre-suspend-time suspends are allowed than long-duration-pre-suspend-time suspends.

Following is an example in which the testing 101 of exemplary NAND devices that are similar to NAND devices 20 (e.g., the same manufacturer, model, manufacturing batch, etc.) has determined that up to 20 suspends can be tolerated for pre-suspend time intervals of less than 300 microseconds, up to 15 suspends can be tolerated for pre-suspend time intervals of more than 300 microseconds and up to 1,000 microseconds, and up to 10 suspends can be tolerated for pre-suspend time intervals of more than 1,000 microseconds. In this embodiment the first pre-suspend time threshold is set at 300 microseconds, which is less than a third of the duration of the erase pulse used by NAND devices 20 and the second pre-suspend time threshold is set at 1,000 microseconds which is approximately the length of the erase pulse used by NAND devices 20. The first erase-suspend limit is set at 20, the second erase-suspend limit is set at 15 and the third erase-suspend limit is set at 10. Each time a suspend is performed having a time within the first interval (less than or equal to 300 microseconds) the counter for the short duration sum is incremented 612 by one. Each time a suspend is performed having a time within the second interval (more than 300 microseconds and less than or equal to 1,000 microseconds) the counter for the medium duration sum is incremented 613 by one. Each time a suspend is performed having a time within the third interval (more than 1,000 microseconds) the counter for the long duration sum is incremented 614 by one. When the first erase-suspend limit reaches 20, the second erase-suspend limit reaches 15 or the third erase-suspend limit reaches 10 further suspends are prevented 110.

By allowing more short-duration-pre-suspend-time suspends than medium-duration-pre-suspend-time suspends, and more medium-duration-pre-suspend-time suspends than long-duration-pre-suspend-time suspends, the method and apparatus of the present invention maintain BER of non-volatile memory devices 20 within the range required to maintain manufacturer-specified endurance and retention specifications while allowing for more erase suspends than the number specified by the manufacturer of nonvolatile memory devices 20.

In other embodiments pre-suspend time may be categorized into more or fewer groupings, depending on the characteristics of NAND devices 20. In one alternate embodiment only two groups are used, a first group having pre-suspend times with short-duration and a second group that includes pre-suspend times having a greater duration. In one exemplary embodiment the erase-suspend limit includes a first erase-suspend limit and a second erase-suspend limit, and the determining whether the erase-suspend limit has been reached includes summing the number of suspends having a pre-suspend time that does not exceed a first pre-suspend time threshold to obtain a first sum, summing the number of suspends having a pre-suspend time that exceeds the first pre-suspend time threshold to obtain a second sum. In this embodiment the erase-suspend limit is reached when the first sum reaches the first erase-suspend limit or when the second sum reaches the second erase-suspend limit. For example, only the first pre-suspend time threshold ($PSTT_1$) of 300 microseconds can be used, producing a first sum that is the sum of pre-suspend times that do not exceed the pre-suspend time threshold and a second sum that is the sum of pre-suspend times that exceed the pre-suspend time threshold. In this embodiment the testing of step 101 identifies a short duration pre-suspend time window in which the erase pulses are not effective to move the BER of the cells being erased, and allows for an increased number of suspends that occur within the identified window as compared to the number of suspends allowed outside of the identified window. For example, in an embodiment in which the NAND device 20 manufacturer only specifies that 10 total suspends are allowed, in one embodiment only 10 total suspends are allowed that have a pre-suspend time greater than that of the identified window. In the present embodiment more suspends are allowed having a pre-suspend time that does not exceed the first pre-suspend time threshold than are allowed having a pre-suspend time that exceeds the first pre-suspend time threshold. For example, up to thirty suspends could be allowed that have a pre-suspend time within the identified window. It is appreciated that more or fewer suspends within the identified window could be allowed, depending on the results of the testing of the sample NAND devices.

Figure 7:
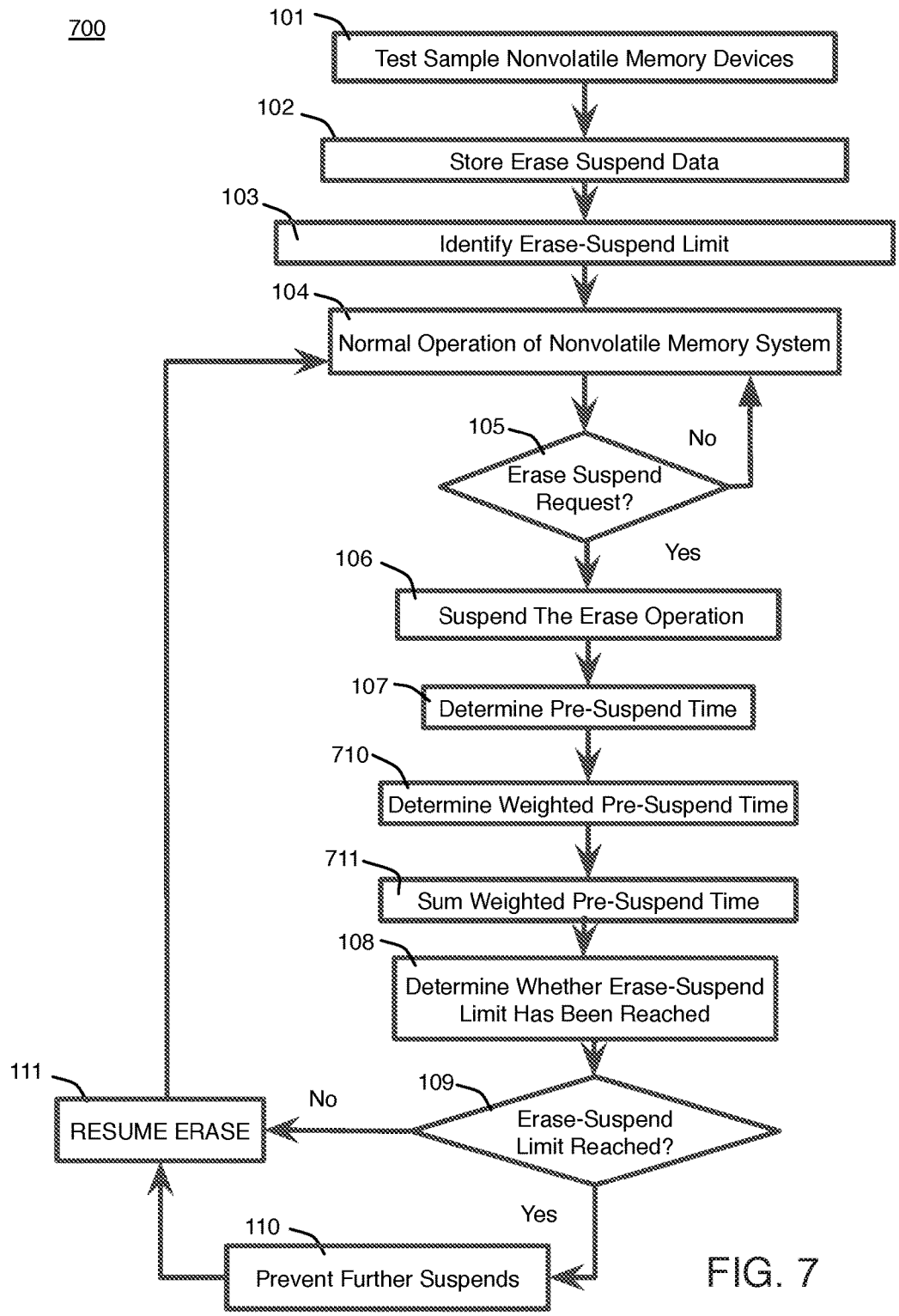
FIG. 7 is a flow diagram illustrating a method for erase suspend management in which weighted pre-suspend time is used in accordance with an embodiment of the present invention.

In method 700 that is shown in FIG. 7, the erase-suspend limit is a weighted pre-suspend time limit. In this embodiment one or more weighted pre-suspend time limit is determined in step 101 by testing sample nonvolatile memory devices similar to the nonvolatile memory devices 20 in nonvolatile memory system 10. The one or more weighted pre-suspend time limit is stored in step 102 and step 103 further includes reading the stored weighted pre-suspend time limit. In one embodiment the stored erase suspend data includes a table indicating program and erase cycle values and corresponding erase-suspend limit values (weighted pre-suspend time limits) and pre-suspend time threshold values, with the values to be used determined by indexing the table with the current number of program and erase cycles of the NAND device 20 being erased. As the ease of erasing NAND devices 20 and BER varies as the number of program and erase cycles increases, this provides identification of an erase-suspend limit that is more accurate since it represents the current point of the lifetime of the NAND device being erased.

Weighted pre-suspend time is determined as shown by step 710 using the pre-suspend time determined in step 107. In one embodiment weighted pre-suspend time is determined by assigning a different weighted pre-suspend time value to each of a plurality of pre-suspend time intervals. Since pre-suspend times having shorter duration have less impact on the BER than longer pre-suspend times, pre-suspend times having a shorter duration will have a lower weighting factor than pre-suspend times having an intermediate pre-suspend time and pre-suspend times having a longer pre-suspend time. Also, pre-suspend times having medium duration have less impact on the BER than suspends with longer pre-suspend times and therefore will have a lower weighting factor than suspends having a longer pre-suspend time.

The weighted pre-suspend time determined in step 710 is summed 711 for each erase operation. The erase-suspend limit is reached 108 when the sum reaches the weighted pre-suspend time limit. More particularly, the summed weighted pre-suspend time for the block subject to the suspend operation is compared to the weighted pre-suspend time limit identified in step 103.

When the summed weighted pre-suspend time reaches the erase-suspend limit (which is the weighted pre-suspend time limit) 109 further suspends of the erase are prevented 110 and the erase is resumed 111, allowing the erase operation to complete without further interruption.

In the present embodiment erase suspend circuit 16 is operable for determining weighted pre-suspend time 710, summing the determined weighted pre-suspend times for the erase operation 711 and storing the sum for each block being erased in memory storage 12 or external memory 17. In addition, erase suspend circuit 16 is operable for comparing the sum determined in step 711 to the weighted pre-suspend time limit identified in step 103 for determining whether the erase-suspend limit has been reached 108. When the summed weighted pre-suspend time reaches the weighted pre-suspend time limit 109 erase suspend circuit 16 resets summed weighted pre-suspend time to zero and prevents further suspends 110.

Figure 8:
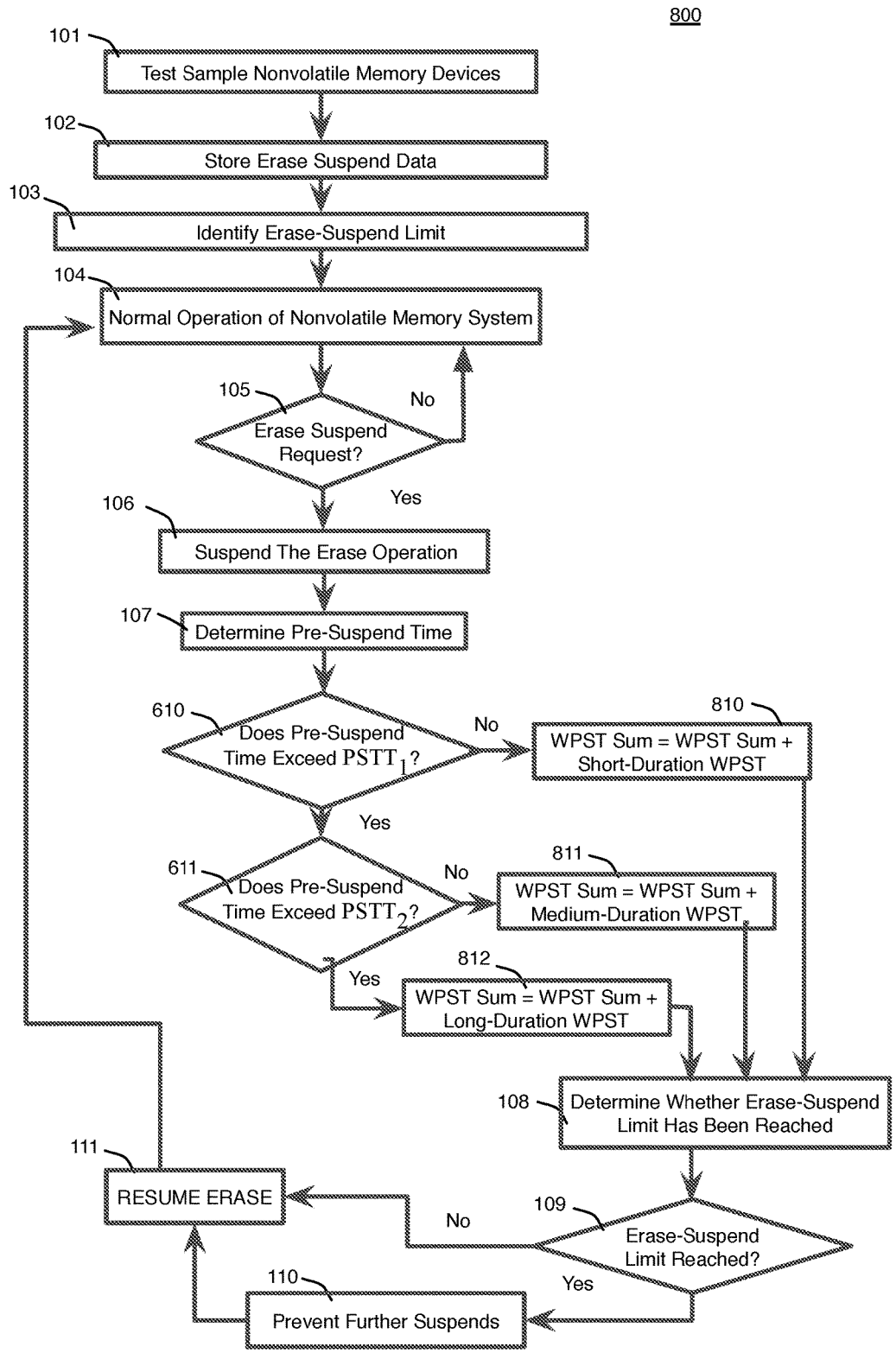
FIG. 8 is a flow diagram illustrating a method for erase suspend management in which two pre-suspend time thresholds are used and in which weighted pre-suspend time is used in accordance with an embodiment of the present invention.
Figure 9A:
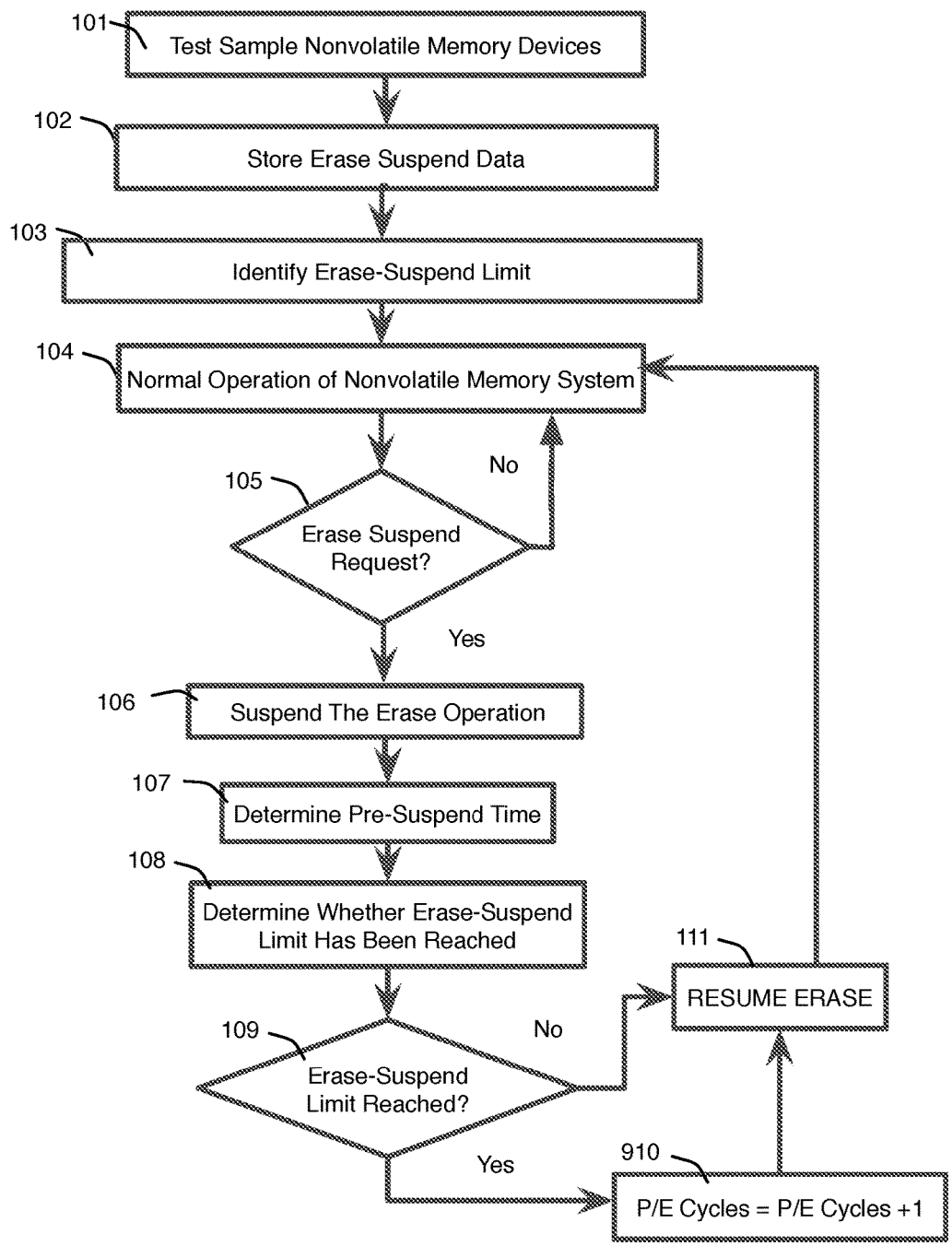
FIG. 9A is a flow diagram illustrating a method for erase suspend management in which the number of program and erase cycles of the block being erased is incremented when the erase-suspend limit is reached in accordance with an embodiment of the present invention.
Figure 9B:
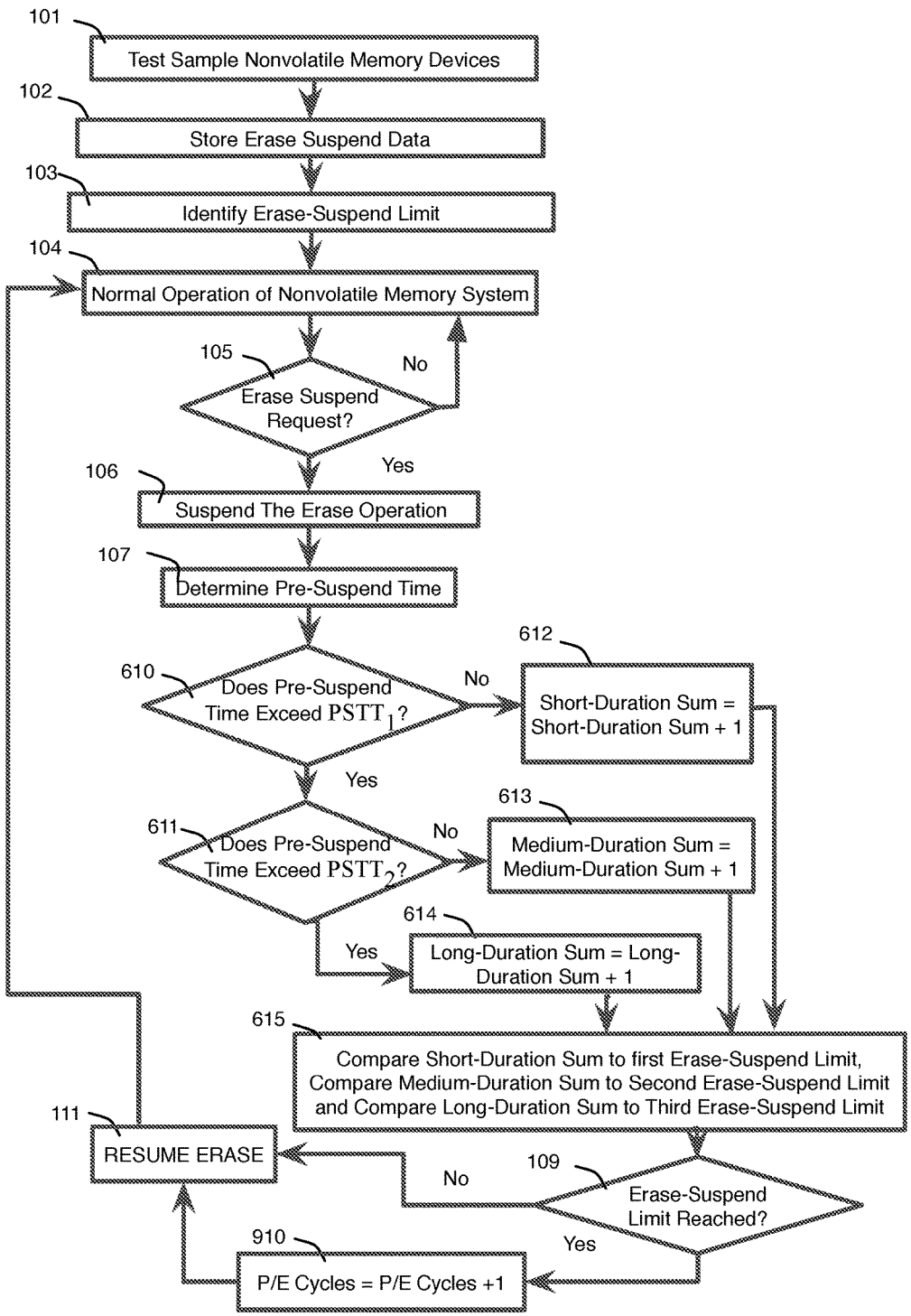
FIG. 9B is a flow diagram illustrating a method for erase suspend management in which two pre-suspend time thresholds are used and in which the number of program and erase cycles of the block being erased is incremented when the erase-suspend limit is reached in accordance with an embodiment of the present invention.
Figure 9C:
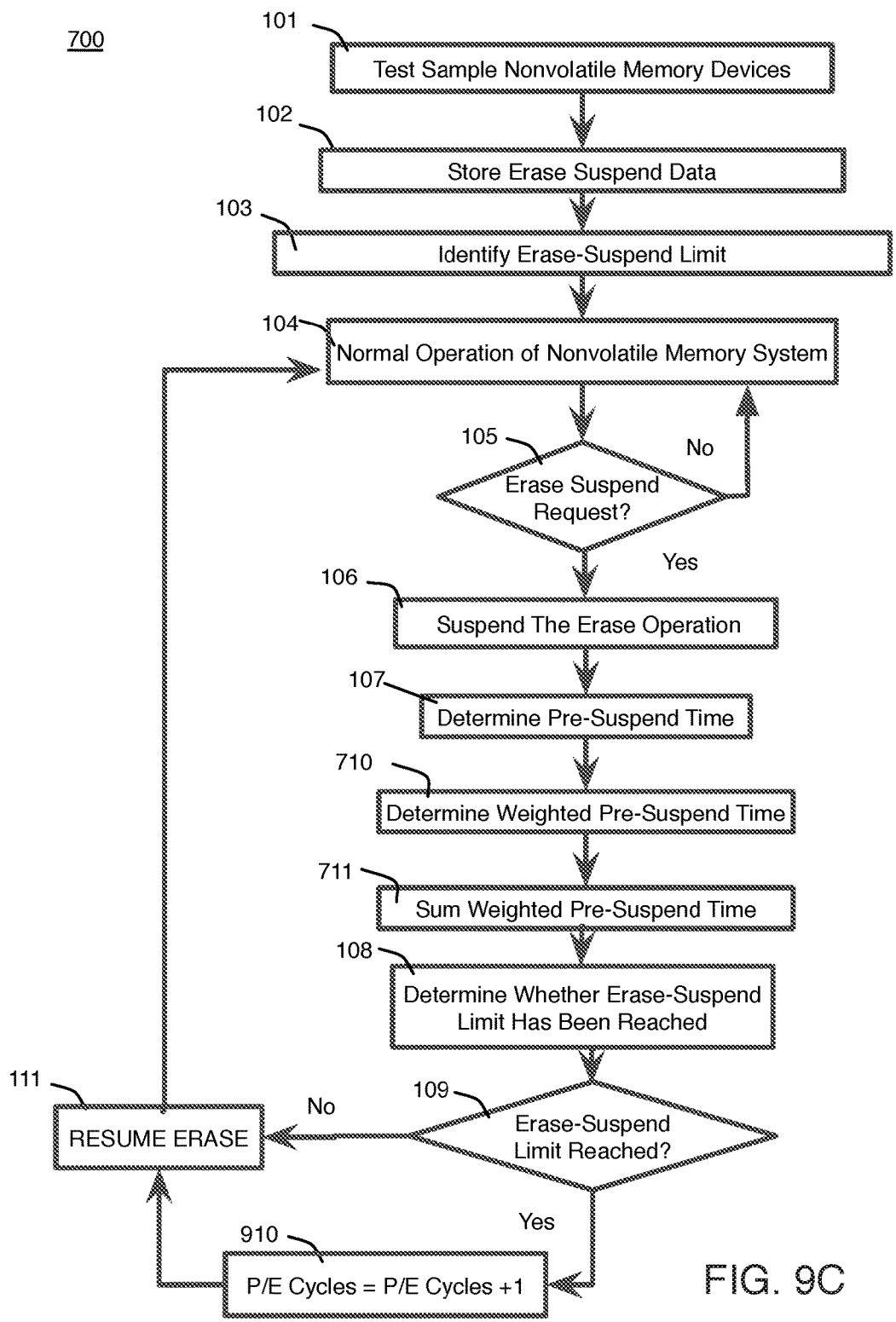
FIG. 9C is a flow diagram illustrating a method for erase suspend management in which weighted pre-suspend time is used and in which the number of program and erase cycles of the block being erased is incremented when the erase-suspend limit is reached in accordance with an embodiment of the present invention.
Figure 9D:
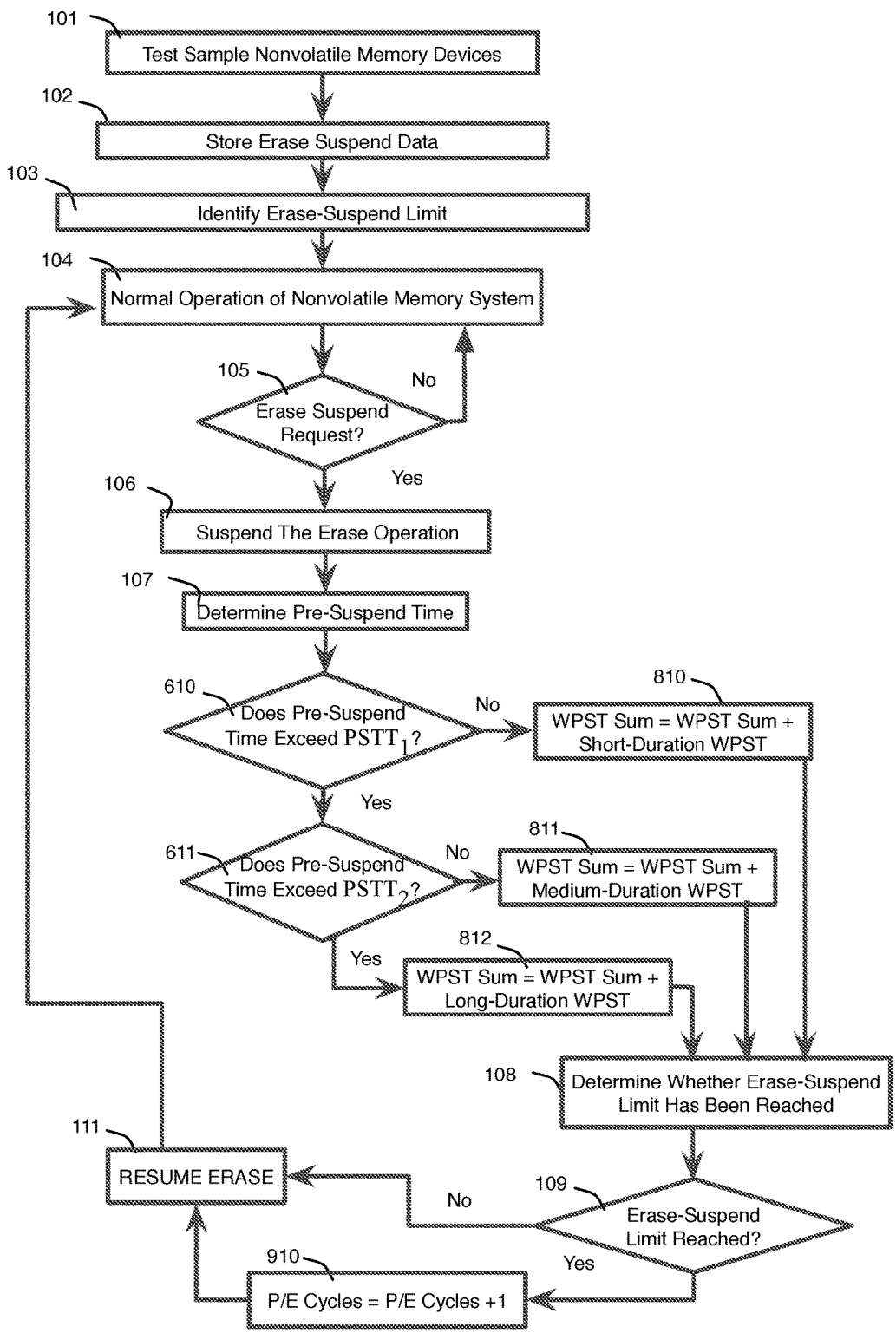
FIG. 9D is a flow diagram illustrating a method for erase suspend management in which two pre-suspend time thresholds are used, in which weighted pre-suspend time is used and in which the number of program and erase cycles of the block being erased is incremented when the erase-suspend limit is reached in accordance with an embodiment of the present invention.

In method 800 that is illustrated in FIG. 8, erase-pre-suspend time is categorized into three groupings, one group that includes pre-suspend times having a short duration, a second group that includes pre-suspend times having a medium duration and a third group that includes pre-suspend times having longer duration. In this embodiment the testing of step 101 determines a weighted pre-suspend time limit, a first pre-suspend time threshold and a second pre-suspend time threshold that define the three groupings of erase pre-suspend time and corresponding weighted pre-suspend times. In the present embodiment, the weighted pre-suspend time (WPST) is equal to a first weighted pre-suspend time (Short-Duration WPST) when the determined pre-suspend time does not exceed a first pre-suspend time threshold. The weighted pre-suspend time is equal to a second weighted pre-suspend time (Medium-Duration WPST) when the determined pre-suspend time exceeds the first pre-suspend time threshold but does not exceed a second pre-suspend time threshold. Similarly, the weighted pre-suspend time is equal to a third weighted pre-suspend time (Long-Duration WPST) when the determined pre-suspend time exceeds the second pre-suspend time threshold. The weighted pre-suspend time is summed in steps 810-812. More particularly the weighted pre-suspend time sum (WPST Sum) is incremented by the short-duration WPST 810 when the determined pre-suspend time does not exceed 610 the first pre-suspend time threshold, incremented by the medium-duration WPST 811 when the determined pre-suspend time exceeds 610 the first pre-suspend time threshold but does not exceed 611 a second pre-suspend time threshold and incremented 812 by the long-duration WPST when the determined pre-suspend time exceeds 611 the second pre-suspend time threshold.

The third weighted suspend (Long-Duration WPST) time is greater than the second weighted pre-suspend time (Medium-Duration WPST), and the second weighted pre-suspend time (Medium-Duration WPST) is greater than the first weighted pre-suspend time (Short-Duration WPST). The WPST sum is compared to the weighted pre-suspend time limit and the erase-suspend limit is reached when the WPST sum reaches the weighted erase-suspend limit. Thereby, more short-duration-suspend-time suspends are allowed than medium-duration-suspend-time suspends, and more medium-duration-suspend-time suspends are allowed than long-duration-suspend-time suspends. Thereby, the method and apparatus of the present invention maintain BER of nonvolatile memory devices 20 within the range required to maintain manufacturer-specified endurance and retention specifications while allowing for more erase suspends than the number specified by the manufacturer of nonvolatile memory devices 20.

Following is an exemplary embodiment in which testing of exemplary NAND devices has determined that up to 20 suspends can be tolerated for pre-suspend time intervals of less than 300 microseconds, up to 15 suspends can be tolerated for pre-suspend time intervals of more than 300 microseconds and up to 1,000 microseconds, and up to 10 suspends can be tolerated for pre-suspend time intervals of more than 1,000 microseconds. This gives a weighting factor of 45/20=2.25 for pre-suspend times having a short-duration pre-suspend time, a weighting factor of 45/15=3 for erase suspends having a medium-duration pre-suspend time and a weighting factor of 45/10=4.5 for erase suspends having a long-duration pre-suspend time and a weighted pre-suspend time limit of 45. Each time a suspend is performed having a time within the first interval (less than or equal to 300 microseconds) a weighted pre-suspend time of 2.25 is summed in step 810. Each time a suspend is performed having a time within the second interval (more than 300 microseconds and less than or equal to 1,000 microseconds) a weighted pre-suspend time of 3 is summed in step 811. Each time a suspend is performed having a time within the third interval (more than 1,000 microseconds) a weighted pre-suspend time of 4.5 is summed in step 812. When the weighted pre-suspend time sum reaches 45 further suspends are prevented 110.

In this embodiment the weighted pre-suspend time limit is 45, allowing for the erase operation to continue to be suspended until the weighted pre-suspend time sum reaches 45. At that time, further suspends of the erase are prevented 110 and the erase is resumed 111. Thus, a total number of 20 suspends are allowed when all are within the first interval, a total of 15 suspends are allowed when all are within the second interval, and a total of 10 suspends are allowed when all are within the third interval.

In other embodiments erase-pre-suspend time may be categorized into more or fewer groupings, depending on the characteristics of NAND devices 20. In one alternate embodiment only two groups are used, a first group having pre-suspend times with short duration and a second group that includes pre-suspend times having a greater duration, with different weighting applied to each group. In this embodiment the weighted pre-suspend time is equal to a first weighted pre-suspend time when the determined pre-suspend time does not exceed the first pre-suspend time threshold and the weighted pre-suspend time is equal to a second weighted pre-suspend time that is greater than the first weighted pre-suspend time when the determined pre-suspend time exceeds the first pre-suspend time threshold. In this embodiment the erase-suspend limit is reached when the sum reaches the weighted erase-suspend limit. In this embodiment the testing of step 101 identifies a short duration pre-suspend time window in which the erase pulses are not effective to move the BER of the cells being erased, and allows for an increased number of suspends that occur within the identified window as compared to the number of suspends allowed outside of the identified window. For example, in an embodiment in which the NAND device 20 manufacturer only specifies that 10 total suspends are allowed, in one embodiment only 10 total suspends are allowed that have a pre-suspend time greater than that of the identified window and up to 30 suspends are allowed having a pre-suspend time within the identified window, giving a weighting factor of 1 to each pre-suspend time within the identified time window and a weighting factor of 3 to each pre-suspend time outside of the identified time window and a weighted suspend-time limit of 30. Accordingly, each time that the determined pre-suspend time does not exceed the first pre-suspend time threshold the weighted pre-suspend time sum is incremented by one and each time that the determined pre-suspend time exceeds the first pre-suspend time threshold the weighted pre-suspend time sum is incremented by a value of three. Thus, significantly more suspends are allowed having a pre-suspend time that does not exceed the first pre-suspend time threshold than are allowed having a pre-suspend time that exceeds the first pre-suspend time threshold. It is appreciated that more or fewer suspends within the identified window could be allowed, depending on the results of the testing of the sample NAND devices in step 101.

In one alternate embodiment weighted pre-suspend time is determined 710 by multiplying the pre-suspend time determined in step 107 by a suspend weighting factor determined in step 101. The suspend weighting factor in this embodiment more heavily weights suspends outside of the pre-suspend time window in which the erase pulses are not effective to significantly move the BER of the cells being erased.

In one embodiment that is illustrated in FIGS. 9A-9D, instead of preventing further suspends, the number of program and erase cycles is incremented by one when the erase-suspend limit is reached. In this embodiment, the testing of step 101 determines an erase-suspend limit that corresponds to the effect of the suspensions on the BER of the block being erased. In one embodiment, the erase-suspend limit is chosen so that BER introduced by the suspends allowed by the erase-suspend limit is equal to the BER introduced by a single program and erase cycle. By increasing the number of P/E cycles for the block being erased when an erase-suspend limit is reached, the method and apparatus of the present invention takes into account the effect of the suspends on BER. Thereby, the increased number of suspends will not result in a bad block condition as could occur in prior art systems if the number of allowed suspends were to be exceeded.

In one specific embodiment, status circuit 13 maintains the number of program and erase cycles of each block and stores the number of program and erase cycles in memory storage 12 or in the spare area of one or more of nonvolatile memory devices 20. In this embodiment erase suspend circuit 16 is configured for determining a pre-suspend time each time that an erase operation of the nonvolatile memory device is suspended, for determining whether an erase-suspend limit has been reached using the determined pre-suspend time and incrementing the number of program and erase cycles for the block being erased when the erase-suspend limit has been reached. In the embodiment shown in FIG. 2 erase suspend circuit 16 is operable to indicate to status circuit 13 that the number of program and erase cycles is to be incremented by one and status circuit 13 is operable to increment the number of program and erase cycles of the block being erased by one. Alternatively, erase suspend circuit 16 is operable to increment the number of program and erase cycles by 1 independently of status circuit 13 (e.g., by incrementing a value stored in memory storage 12 or in the spare area of the NAND device 20 being erased). Erase suspend circuit 16 then resets the counters used for determining whether the erase-suspend limit has been reached and allows the erase operation to resume 111. More particularly, in the embodiment shown in FIG. 9B, the short-duration sum counter, the medium-duration sum counter and the long-duration sum counter are reset to 0 and the erase is resumed 111. Similarly, in the embodiment shown in FIGS. 9C-9D, the weighted pre-suspend time sum is reset to 0 and the erase is resumed 111. In the embodiments of FIGS.

9A-9D, further suspends are not prevented, but are always allowed. This allows for the user to make a trade-off between speed and lifespan of nonvolatile memory devices 20. More particularly, the lifespan of the block is reduced as a result of the number of added program and erase cycles, reducing the overall lifespan of the nonvolatile memory devices 20. However, the number of suspends is not limited at all, allowing for a much faster nonvolatile memory system and a higher quality of service.

By allowing for more erase suspends, the method and apparatus of the present invention allows for more suspends than prior art systems, providing a nonvolatile memory system having improved quality of service.

Unless specifically stated otherwise as apparent from the discussion, it is appreciated that throughout the description, discussions utilizing terms such as "testing", "identifying", "generating", "comparing", "sending", "summing", "preventing", or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, for purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What is claimed is:

1. A method comprising:
   identifying an erase-suspend limit;
   sending an erase suspend command to a nonvolatile memory device to suspend an erase operation of the nonvolatile memory device;
   each time that the erase suspend command is sent to the nonvolatile memory device:
      determining a pre-suspend time, wherein the pre-suspend time for a first suspend of the erase operation is the time between a start of the erase operation and the first suspend of the erase operation, and the pre-suspend time for each additional suspend of the erase operation is the time between a resumption of the erase operation and the following suspend of the erase operation;
      summing the determined pre-suspend time with all previously determined pre-suspend times for the erase operation to obtain a first sum; and
      comparing the first sum to the erase-suspend limit to determine whether the erase-suspend limit has been reached; and
   incrementing a number of program and erase cycles when the erase-suspend limit has been reached.

2. The method of claim 1 further comprising testing sample nonvolatile memory devices that are similar to the nonvolatile memory device to determine the erase-suspend limit that will maintain the operation of the sample nonvolatile memory devices within required bit error rates established for the sample nonvolatile memory devices.

3. The method of claim 1 further comprising counting the number of program and erase cycles by incrementing a counter upon each program and each erase operation, wherein the incrementing a number of program and erase cycles when the erase-suspend limit has been reached further comprises incrementing the counter each time that the erase-suspend limit is reached.

4. A method comprising:
   identifying a first erase-suspend limit, a second erase-suspend limit and a third erase-suspend limit, wherein the first erase-suspend limit is greater than the second erase-suspend limit and the second erase-suspend limit is greater than the third erase-suspend limit;
   each time that an erase operation of a nonvolatile memory device is suspended:
      determining a pre-suspend time, wherein the pre-suspend time for a first suspend of the erase operation is the time between a start of the erase operation and the first suspend of the erase operation, and the pre-suspend time for each additional suspend of the erase operation is the time between a resumption of the erase operation and the following suspend of the erase operation;
      counting the number of suspends having a pre-suspend time that does not exceed a first pre-suspend time threshold to obtain a first sum;
      counting the number of suspends having a pre-suspend time that exceeds the first pre-suspend time threshold and that does not exceed a second pre-suspend time threshold to obtain a second sum; and
      counting the number of suspends having a pre-suspend time that exceeds the second pre-suspend time threshold to obtain a third sum; and
   incrementing a number of program and erase cycles when the first sum reaches the first erase-suspend limit or when the second sum reaches the second erase-suspend limit or when the third sum reaches the third erase-suspend limit.

5. The method of claim 4 further comprising testing sample nonvolatile memory devices that are similar to the nonvolatile memory device to determine the first erase-suspend limit, the second erase-suspend limit, the third erase-suspend limit, the first pre-suspend time threshold and the second pre-suspend time threshold that will maintain the operation of the sample nonvolatile memory devices within required bit error rates established for the sample nonvolatile memory devices.

6. A method comprising:
   identifying an erase-suspend limit;
   sending an erase suspend command to a nonvolatile memory device to suspend an erase operation of the nonvolatile memory device;
   each time that the erase suspend command is sent to the nonvolatile memory device:
      determining a pre-suspend time, wherein the pre-suspend time for a first suspend of the erase operation is the time between a start of the erase operation and the first suspend of the erase operation, and the pre-suspend time for each additional suspend of the erase operation is the time between a resumption of the erase operation and the following suspend of the erase operation;

determining a weighted pre-suspend time using the determined pre-suspend time;

summing the determined weighted pre-suspend time with all previously determined weighted pre-suspend times for the erase operation to obtain a first sum; and comparing the first sum to the erase-suspend limit to determine whether the erase-suspend limit has been reached; and incrementing a number of program and erase cycles when the erase-suspend limit has been reached.

7. The method of claim 6 wherein:

the weighted pre-suspend time is equal to a predetermined first weighted pre-suspend time when the determined pre-suspend time does not exceed a first pre-suspend time threshold; and the weighted pre-suspend time is equal to a predetermined second weighted pre-suspend time that is greater than the first weighted pre-suspend time when the determined pre-suspend time exceeds the first pre-suspend time threshold.

8. The method of claim 6 wherein:

the weighted pre-suspend time is equal to a predetermined first weighted pre-suspend time when the determined pre-suspend time does not exceed a first pre-suspend time threshold;

the weighted pre-suspend time is equal to a predetermined second weighted pre-suspend time when the determined pre-suspend time exceeds the first pre-suspend time threshold but does not exceed a second pre-suspend time threshold;

the weighted pre-suspend time is equal to a predetermined third weighted pre-suspend time when the determined pre-suspend time exceeds the second pre-suspend time threshold; and wherein the third weighted pre-suspend time is greater than the second weighted pre-suspend time, and the second weighted pre-suspend time is greater than the first weighted pre-suspend time.

9. The method of claim 6 further comprising testing sample nonvolatile memory devices that are similar to the nonvolatile memory device to determine the first weighted pre-suspend time, the second weighted pre-suspend time, the third weighted pre-suspend time, the first pre-suspend time threshold and the second pre-suspend time threshold that will maintain the operation of the sample nonvolatile memory devices within required bit error rates established for the sample nonvolatile memory devices.

10. The method of claim 6 further comprising storing a table that includes weighted pre-suspend time values, the determining a weighted pre-suspend time comprising indexing the table with the determined pre-suspend time to obtain a corresponding weighted pre-suspend time value.

11. The method of claim 6 wherein determining a weighted pre-suspend time further comprises multiplying the determined pre-suspend time by a weighting factor.

12. A nonvolatile memory controller comprising:

an erase suspend circuit configured for suspending an erase operation of a nonvolatile memory device by sending an erase suspend command to the nonvolatile memory device, each time that the erase suspend command is sent to the nonvolatile memory device, the erase suspend circuit configured for:

determining a pre-suspend time, wherein the determined pre-suspend time for a first suspend of the erase operation is the time between a start of the erase operation and the first suspend of the erase operation, and the determined pre-suspend time for each additional suspend of the erase operation is the time between a resumption of the erase operation and the following suspend of the erase operation;

summing the determined pre-suspend time with all previously determined pre-suspend times for the erase operation;

comparing the sum to an erase-suspend limit to determine whether the erase-suspend limit has been reached; and incrementing a number of program and erase cycles when the erase-suspend limit has been reached.

13. A nonvolatile memory controller comprising:

an erase suspend circuit configured for suspending an erase operation of a nonvolatile memory device by sending an erase suspend command to the nonvolatile memory device, each time that the erase suspend command is sent to the nonvolatile memory device, the erase suspend circuit configured for:

determining a pre-suspend time, wherein the determined pre-suspend time for a first suspend of the erase operation is the time between a start of the erase operation and the first suspend of the erase operation, and the determined pre-suspend time for each additional suspend of the erase operation is the time between a resumption of the erase operation and the following suspend of the erase operation;

counting the number of suspends of the erase operation having a pre-suspend time that does not exceed a first pre-suspend time threshold to obtain a first sum;

counting the number of suspends of the erase operation having a pre-suspend time that exceeds the first pre-suspend time threshold to obtain a second sum;

comparing the first sum to a first erase-suspend limit;

comparing the second sum to a second erase-suspend limit; and incrementing a number of program and erase cycles when the first sum reaches the first erase-suspend limit or when the second sum reaches the second erase-suspend limit.

14. The nonvolatile memory controller of claim 13 further comprising:

wherein the erase suspend circuit is configured to count the number of suspends of the erase operation having a pre-suspend time that exceeds the first pre-suspend time threshold by counting the number of suspends having a pre-suspend time that exceeds the first pre-suspend time threshold and that does not exceed a second pre-suspend time threshold to obtain the second sum, and count the number of suspends having a pre-suspend time that exceeds a second pre-suspend time threshold to obtain a third sum;

wherein the erase suspend circuit is configured to compare the third sum to a third erase-suspend limit; and wherein the erase suspend circuit is configured to increment the number of program and erase cycles when the first sum reaches the first erase-suspend limit or when the second sum reaches the second erase-suspend limit or when the third sum reaches the third erase-suspend limit.

15. A nonvolatile memory controller comprising:

an erase suspend circuit configured for suspending an erase operation of a nonvolatile memory device by sending an erase suspend command to the nonvolatile memory device, each time that the erase suspend command is sent to the nonvolatile memory device, the erase suspend circuit configured for:
- determining a pre-suspend time, wherein the determined pre-suspend time for a first suspend of the erase operation is the time between a start of the erase operation and the first suspend of the erase operation, and the determined pre-suspend time for each additional suspend of the erase operation is the time between a resumption of the erase operation and the following suspend of the erase operation;
- determining a weighted pre-suspend time using the determined pre-suspend time;
- summing the determined weighted pre-suspend time with all previously determined weighted pre-suspend times for the erase operation;
- comparing the sum to an erase-suspend limit to determine whether the erase-suspend limit has been reached; and
- incrementing a number of program and erase cycles when the erase-suspend limit has been reached.

16. The nonvolatile memory controller of claim 15 wherein the erase suspend circuit is configured for determining that the weighted pre-suspend time is equal to a first weighted pre-suspend time when the determined pre-suspend time does not exceed a first pre-suspend time threshold and determining that the weighted pre-suspend time is equal to a second weighted pre-suspend time that is greater than the first weighted pre-suspend time when the determined pre-suspend time exceeds the first pre-suspend time threshold.

17. The nonvolatile memory controller of claim 16 wherein the first pre-suspend time threshold is 300 microseconds and the second pre-suspend time threshold is 1,000 microseconds.

18. The nonvolatile memory controller of claim 15 wherein the erase suspend circuit is configured for determining that the weighted pre-suspend time is equal to a first weighted pre-suspend time when the determined pre-suspend time does not exceed a first pre-suspend time threshold, determining that the weighted pre-suspend time is equal to a second weighted pre-suspend time when the determined pre-suspend time exceeds the first pre-suspend time threshold but does not exceed a second pre-suspend time threshold and determining that the weighted pre-suspend time is equal to a third weighted pre-suspend time when the determined pre-suspend time exceeds the second pre-suspend time threshold, wherein the third weighted pre-suspend time is greater than the second weighted pre-suspend time, and the second weighted pre-suspend time is greater than the first weighted pre-suspend time.

19. The nonvolatile memory controller of claim 15 wherein the weighted pre-suspend time is determined by multiplying the determined pre-suspend time by a weighting factor.

20. The nonvolatile memory controller of claim 15 wherein the weighted pre-suspend time is determined by indexing a table with the determined pre-suspend time to obtain the corresponding weighted pre-suspend time.

* * * * *